(12) United States Patent
Hamilton

(10) Patent No.: US 7,573,572 B1
(45) Date of Patent: Aug. 11, 2009

(54) DRIFT TUBE AMPLIFIER AND METHOD TO AMPLIFY CURRENT

(75) Inventor: Brett J Hamilton, Heltonville, IN (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 746 days.

(21) Appl. No.: 11/229,443

(22) Filed: Sep. 7, 2005

(51) Int. Cl.
*G01J 3/42* (2006.01)
(52) U.S. Cl. .................. 356/319; 356/327; 356/442; 356/433; 250/423 R; 250/288
(58) Field of Classification Search ......... 356/222–226, 356/229, 319, 433, 442, 326, 327; 250/282–286, 250/382–385, 423 R, 423 P, 288; 315/5.35, 315/5.39, 5.51, 5.43
See application file for complete search history.

(56) References Cited

U.S. PATENT DOCUMENTS

| 3,383,545 | A | * | 5/1968 | Heil ........................ 315/5.39 |
| 3,922,091 | A | * | 11/1975 | Suva et al. ................ 356/319 |
| 4,390,784 | A | * | 6/1983 | Browning et al. ........... 250/287 |
| 4,472,356 | A | | 9/1984 | Kolesar, Jr. |
| 4,500,205 | A | * | 2/1985 | Watanabe ................... 356/325 |
| 4,726,679 | A | | 2/1988 | McCaffrey |
| 4,877,979 | A | * | 10/1989 | Sempel ....................... 327/555 |
| 4,906,440 | A | | 3/1990 | Kolesar, Jr. |
| 5,481,218 | A | | 1/1996 | Nordholt et al. |
| 5,521,548 | A | | 5/1996 | Sugawara |
| 5,522,980 | A | | 6/1996 | Hobbs et al. |
| 6,368,560 | B1 | | 4/2002 | Ostrander et al. |
| 6,883,364 | B2 | | 4/2005 | Sunshine et al. |
| 6,900,890 | B1 | | 5/2005 | Rice |
| 7,268,881 | B2 | * | 9/2007 | Larsen et al. ............... 356/436 |

OTHER PUBLICATIONS

M.C. Vogt, L.R. Skubal, Voltammetric Microsensors, Sensor Technology and Design, Feb. 2005.

* cited by examiner

*Primary Examiner*—Haissa Philogene
(74) *Attorney, Agent, or Firm*—John Gladstone Mills, II; Mark O. Glut; U.S. Navy-NAVAIR Naval Air Sys Command

(57) ABSTRACT

A drift tube amplifier having an input and an output. The drift tube amplifier including a current-to-voltage converter for converting input current to a voltage, a band pass filter assembly for reducing unwanted noise within the voltage, a voltage controlled amplifier for adjusting the output voltage level, and a logarithmic ratio converter for converting the voltage from linear to LOG scale.

9 Claims, 3 Drawing Sheets

DRIFT TUBE AMPLIFIER AND METHOD TO AMPLIFY CURRENT

STATEMENT OF GOVERNMENT INTEREST

The invention described herein may be manufactured and used by or for the Government of the United States of America for governmental purposes without payment of any royalties thereon or therefor.

BACKGROUND

The present invention relates to an amplifier and method to amplify current. More specifically, but without limitation, the present invention relates to a drift tube amplifier and method to amplify current that can be used in conjunction with a chemical agent detection system.

Amplifiers are, but without limitation, mechanisms or devices that make certain outputs greater or larger. Specifically, amplifiers may increase the amplitude of something or allow it to be heard or detected easier. The United States Navy utilizes amplifiers in chemical agent detection systems, specifically systems that detect nerve and blister agents. These amplifiers must amplify extremely low currents that are produced when ions strike a Faraday Cup. A Faraday Cup may be defined, but without limitation, as a device for precisely measuring the current carried by a beam of particles.

The United States Navy utilizes Ion Mobility Spectrometry ("IMS") to identify different species of chemical agents, including nerve and blister agents. IMS is a gas-phase ion separation technique. Ions are formed in a source region, accelerated through a potential gradient with a counter-current drift gas (typically air), and the ions collide with a collector (typically a Faraday Cup). When an ion collides with the collector (the Faraday Cup), it induces an extremely small current. The current must be converted and then analyzed by a processor or processor board. The processor board, based on the current, determines if there is a chemical agent in the air. Since the current is extremely small, it must be amplified and transformed in order for the processor board to properly read and analyze any input received. Thus, there is a need for an amplifier that can transform and amplify the current into a form such that the current may be read and analyzed.

SUMMARY

The present invention is directed to a drift tube amplifier that includes a current-to-voltage converter for converting extremely low input current to a voltage, a band pass filter assembly for reducing unwanted noise within the voltage, a voltage controlled amplifier for adjusting the output voltage level, and a logarithmic ratio converter for converting the voltage from linear to LOG scale, thereby increasing the dynamic range of the output.

It is a feature of the invention to provide a drift tube amplifier that can convert and amplify a low input current to a form that can be read and analyzed, specifically by a processor board of a chemical agent detector.

It is a feature of the invention to provide a drift tube amplifier that minimizes saturation of the amplifier and minimizes long negative tails on the signals.

It is a feature of the invention to provide a drift tube amplifier that allows a user or computer to remotely adjust system gain.

BRIEF DESCRIPTION OF THE DRAWINGS

These and other features, aspects and advantages of the present invention will become better understood with reference to the following description and appended claims, and accompanying drawings wherein:

DETAILED DESCRIPTION OF THE EMBODIMENTS

Figure 1:
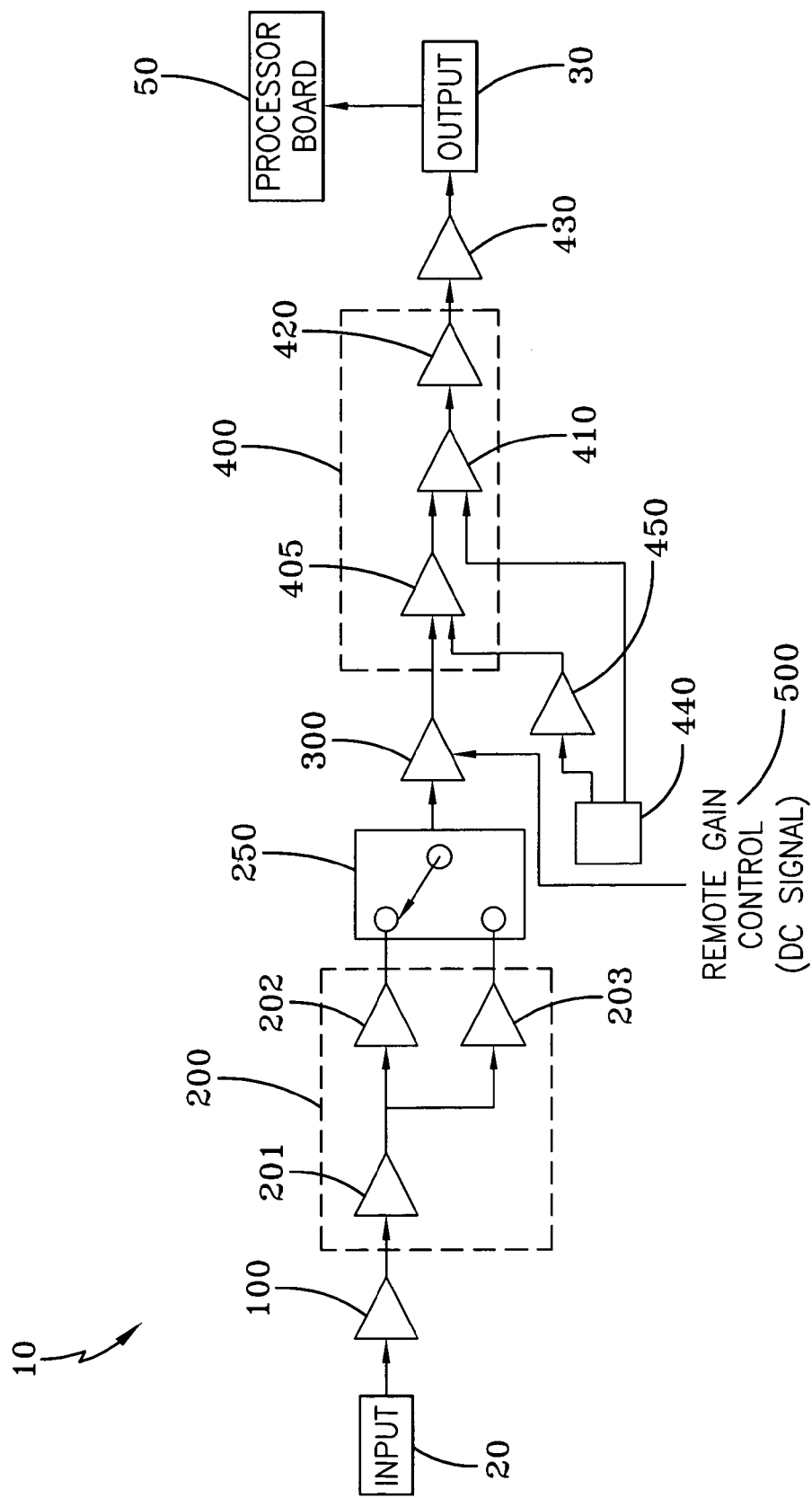
FIG. 1 is a block diagram of an embodiment of the drift tube amplifier.

The preferred embodiment of the present invention is illustrated by way of example below and in FIGS. 1-3. As seen in FIG. 1, the drift tube amplifier 10 includes a current-to-voltage converter 100 for converting extremely low input current 20 to a voltage, a band pass filter assembly 200 for reducing unwanted noise within the voltage, a voltage controlled amplifier 300 for adjusting the output voltage level, and a logarithmic ratio converter 400 for converting the voltage from linear to LOG scale, thereby increasing the dynamic range of the output voltage 30.

In the description of the present invention, the invention will be discussed in a chemical agent detection system environment; however, this invention can be utilized for any type of need that requires use of an amplifier.

The current-to-voltage converter 100 converts extremely low input current 20 to a voltage. Typically ion detectors emit a low current that is difficult to detect. In operation, this low current would be in ambient air as a result of ions in the air striking a Faraday Cup. The resultant current is the input 20 into the current-to-voltage converter 100. The low current is converted by the current-to-voltage converter 100 into a voltage. As shown in FIG. 2, the current-to-voltage converter 100 may include a converter 101, capacitors 102 and resistors 103. The preferred converter 101, capacitor 102, and resistor 103 configuration of the current-to-voltage converter 100 is shown in FIGS. 2 and 3. The preferred capacitance and resistance of the components are shown in FIG. 2 next to each respective component.

After being converted by the current-to-voltage converter 100, the voltage then passes to and through the band pass filter assembly 200. The band pass filter assembly 200 reduces noise such as wide band noise and/or interference. The band pass filter assembly 200 may be one filter, a group of filters with various electronic components or any type of filter configuration practicable. The band pass filter assembly 200 may include a first order band pass filter 201 and a set of inverting and non-inverting filters. In the preferred embodiment of the invention, as seen in FIG. 1, after exiting the current-to-voltage converter 100, the voltage passes through a first order band pass filter 201. As seen in FIG. 2, the first order band pass filter 201 includes a high pass filter 204 (which includes 2 capacitors 206 in series) and a low pass filter 205 (which includes a filter 207, a capacitor 206 and resistors 208). The preferred filter 207, capacitor 206, and resistor 208 configuration of the first order band pass filter assembly 201 is shown in FIGS. 2 and 3. The preferred capacitance and resistance of the components are shown in FIG. 2 next to each respective component.

In the preferred embodiment of the invention, after leaving the first order band pass filter 201, the voltage enters an inverting/non-inverting stage. Some chemical agents produce positive ions while other agents produce negative ions. The processor detection algorithms within the processor board 50 of the chemical detection system are typically designed to work with a positive signal only; therefore, a negative signal (current/voltage from negative ions) must be converted to a positive signal for the chemical detection system to be effective. Negative voltage, derived from negative current/input 20 (which is derived from negative ions), enters an inverting second order low pass filter 202. The inverting second order low pass filter 202 inverts and changes the negative voltage into a positive voltage. Positive voltage, derived from positive current/input 20 (which is derived from positive ions) enters a non-inverting second order low pass filter 203. Each of these filters 202, 203 may include resistors 208 and capacitors 206. The preferred filter 202, 203, capacitor 206, and resistor 208 configuration of the inverting filter 202 and the non-inverting filter 203 is shown in FIGS. 2 and 3. The preferred capacitance and resistance of the components are shown in FIG. 2 next to each respective component.

After passing one of the second order low pass filters (the inverting 202 or the non-inverting 203), the voltage enters a polarity switch 250, whereby the voltage from either second order low pass filter (202 or 203) may be passed to the voltage controlled amplifier 300. The polarity switch 250 may be electronically controlled by a processor or any type of apparatus practicable.

After leaving the polarity switch 250, the voltage then passes to the voltage controlled amplifier 300. The voltage controlled amplifier 300 may be attached to a remote gain control 500. The remote gain control 500 allows the operator, a processor or a computer to remotely adjust the output voltage 30 level. The remote gain control 500 may communicate with the voltage controlled amplifier 300 via a DC signal or any type of method practicable. A precision IC multiplier may be used to remotely adjust the amplifier gain. In order to keep unwanted signal interference to a minimum, a DC gain control configuration may be utilized. This allows the aggressive filtering of disruptive 60Hz line power interference. The preferred electronic configuration of the remote control gain 500 is shown in FIG. 2. The gain is controlled via adjusting $V_{CONTROL}$ in Equation 1 ($V_{CONTROL}$ is a DC Voltage) using a remote potentiometer for manual adjustment or a digital-to-analog converter (DAC) for computer control in the automatic gain control (AGC) mode. In the preferred embodiment of the invention, the gain control is described by the following equation:

$$V_{OUT} = \frac{V_{CONTROL} * V_{SIGNAL}}{0.1} \quad \text{(Equation 1)}$$

whereby $V_{out}$ is the gain adjusted output signal (the voltage exiting the voltage controlled amplifier 300), $V_{CONTROL}$ is the controlling DC voltage, and $V_{signal}$ is the input to the voltage controlled amplifier (the voltage entering the voltage controlled amplifier 300).

After the output voltage level is adjusted, the voltage then enters a logarithmic ratio converter 400, which converts the voltage from linear to logarithmic (LOG) scale. This conversion creates a compressive effect and increases the dynamic range of the output 30. In the preferred embodiment of the invention, the following equation represents the general form of the conversion of the logarithmic ratio converter 400:

$$V_{LOG} = V_{REF} - \left(\frac{Resistor411}{Resistor421}\right) * \text{LOG} \frac{I_{REF}}{I_{SIGNAL}} \quad \text{(Equation 2)}$$

wherein $V_{LOG}$ is the output voltage exiting the logarithmic ratio converter 400, $V_{REF}$ is full scale output reference voltage, $I_{REF}$ is a reference current, $I_{SIGNAL}$ is the signal current (the current entering the drift tube amplifier 10), Resistor411 is the resistance of a particular resistor 411 disposed within the logarithmic ratio converter 400, Resistor421 is the resistance of another particular resistor 421 disposed within the logarithmic ratio converter 400. The reference current, $I_{REF}$, may be created by a precision voltage reference 440 and an operational amplifier 450. The precision voltage reference 440 may generate about 10 volts. As seen in FIG. 2, the precision voltage reference 440 and the operational amplifier 450 may electronically communicate with the logarithmic ratio converter 400. In the preferred embodiment the value of the term or ratio (Resistor411/Resistor421) is two (2), as shown in Equation 3:

$$V_{LOG} = V_{REF} - \left(\frac{2}{1}\right) * \text{LOG} \frac{I_{REF}}{I_{SIGNAL}} \quad \text{(Equation 3)}$$

In the preferred embodiment, the logarithmic ratio converter 400 includes a log ratio amplifier 405, a scaling amplifier 410 and a second order low pass filter 420. The log ratio amplifier 405 computes the log ratio of an input current relative to the reference current. After passing through the log ratio amplifier 405, the voltage (now in LOG form) then enters the scaling amplifier 410 that shifts and scales the output level to the desired range for the system processor or processor board 50 (typically configured from about 0 to about 10V). The voltage then passes through the second order low pass filter 420 and then to an output buffer 430. The logarithmic ratio converter 400 may include capacitors 401, resistors 402, filters 403 and amplifiers. The preferred filter 403, capacitor 401, and resistor 402 configuration of the logarithmic ratio converter 400 is shown in FIGS. 2 and 3. The preferred capacitance and resistance of the components are shown in FIG. 2.

The output buffer 430 may include a first order low pass filter 431, as well as capacitors 432 and resistors 433. After exiting the output buffer 430, the voltage/output 30 is then passed to a processing board 50 to determine if any and/or what kind of chemical agents are present. The preferred filter 431, capacitor 432 and resistor 433 configuration of the output buffer 430 is shown in FIG. 2. The preferred capacitance and resistance of the components are shown in FIG. 2.

Figure 2:
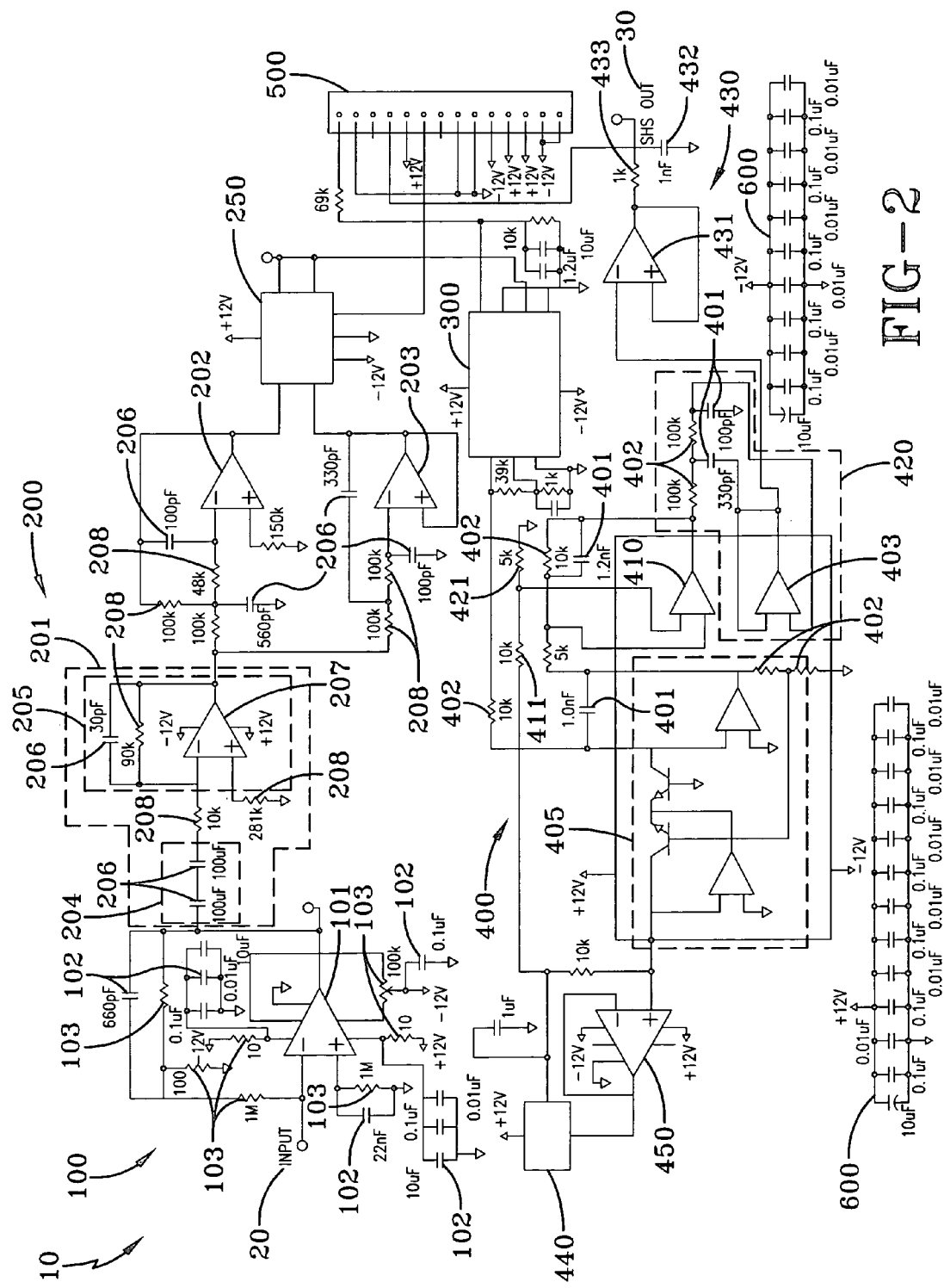
FIG. 2 is a schematic of an embodiment of the drift tube amplifier.

In addition, as seen in FIG. 2, the drift tube amplifier 10 may include decoupling capacitors 600. The decoupling capacitors 600 are electronically communicating with the drift tube amplifier 10 such that the decoupling capacitors 600 reduce power noise from any type of power source used. The decoupling capacitors 600 may be disposed between the power source and the drift tube amplifier 10 (specifically between the power source and the components of the drift tube amplifier 10 that are being supplied power). The decoupling capacitors 600 also may minimize glitches on the power supply induced during signal transitions within active semiconductor integrated circuits.

Figure 3:
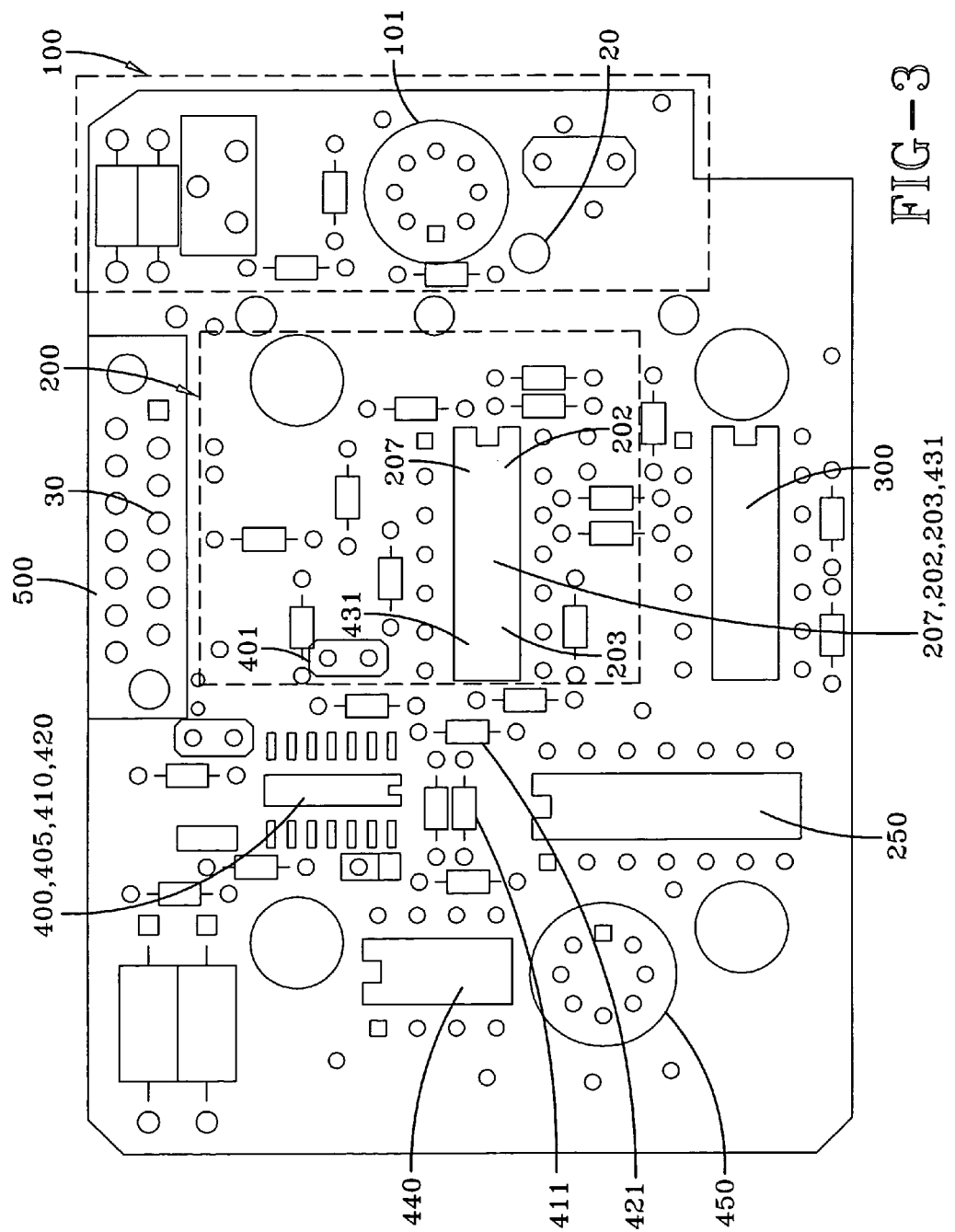
FIG. 3 is a top view of an embodiment of the silkscreen printed circuit board of the drift tube amplifier.

FIG. 3 shows the preferred embodiment of a top view of the silkscreen printed circuit board of the drift tube amplifier.

The method to amplify current includes converting a current to a voltage, reducing unwanted noise within the voltage, adjusting the output voltage level, and converting the voltage from linear to LOG scale, thereby increasing the dynamic range of the output. The output voltage level may be adjusted by passing the voltage through a band pass filter assembly or a series of filters. The preferred band pass filter assembly 200 is described above. The output voltage level may be adjusted utilizing a remote gain control 500, and may be adjusted utilizing the configuration described above. The voltage may be converted utilizing a system described above.

When introducing elements of the present invention or the preferred embodiment(s) thereof, the articles "a," "an," "the," and "said" are intended to mean there are one or more of the elements. The terms "comprising," "including," and "having" are intended to be inclusive and mean that there may be additional elements other than the listed elements.

Although the present invention has been described in considerable detail with reference to certain preferred embodiments thereof, other embodiments are possible. Therefore, the spirit and scope of the appended claims should not be limited to the description of the preferred embodiments contained herein.

What is claimed is:

1. A drift tube amplifier, the drift to be amplifier having an input and an output, the drift tube amplifier comprising:
    a current-to-voltage converter for converting extremely low input current to a voltage;
    a first order band pass filter for reducing unwanted noise within the voltage, the first order band pass filter electronically communicating with the current-to voltage converter; an inverting second order loss pass filter electronically communicating with the first order band pass filter;
    a non-inverting second order low pass filter electronically communicating with the first order band pass filter;
    a polarity switch, wherein negative voltage passing from the first order band pass filter enters the inverting second order low pass filter, and positive voltage passing from the first order band pass filter enters the non-inverting second order low pass filter such that both negative voltage and positive voltage is passed as positive voltage to the polarity switch, the polarity switch electronically communicating with the inverting second order low pass filter and the non-inverting second order low pass filter;
    a voltage controlled amplifier for adjusting the output voltage level of voltage from the polarity switch, the voltage controlled amplified electronically communicating with the polarity switch;
    a logarithmic ratio converter for converting the voltage from linear to LOG scale, thereby increasing the dynamic range of the output, the logarithmic ratio converter includes a log ratio amplifier for computing the log ratio of an input current relative to a reference current, a scaling amplifier for shifting and scaling the output level to a desired range and a second order low pass filter, whereby the voltage passes through each of these, the logarithmic ratio converter electronically communicating with the voltage controlled amplifier;
    an output buffer, the output buffer passing the LOG scale voltage to a processor board, the output buffer electronically communicating with the logarithmic ratio converter; and, a gain-control for remotely adjusting the output voltage level.

2. The drift tube amplifier of claim 1, wherein the gain control is described by the following equation:

$$V_{OUT} = \frac{V_{CONTROL} * V_{SIGNAL}}{0.1},$$

whereby $V_{out}$ is the voltage exiting the voltage controlled amplifier, $V_{CONTROL}$ is controlling DC voltage, and $V_{signal}$ is input to the voltage controlled amplifier.

3. The drift tube amplifier of claim 2, wherein the following equation represents the general form of the conversion made by the logarithmic ratio converter;

$$V_{LOG} = V_{REF} - \left(\frac{2}{1}\right) * \text{LOG}\frac{I_{REF}}{I_{SIGNAL}},$$

wherein $V_{LOG}$ is the output voltage exiting the logarithmic ratio converter, $V_{REF}$ is full scale output reference voltage, $I_{REF}$ is a reference current, and $I_{SIGNAL}$ is the current entering the drift tube amplifier.

4. The drift tube amplifier of claim 3, wherein the reference current is created by a precision voltage reference and an operational amplifier.

5. The drift tube amplifier of claim 1, wherein the input current is from ions in ambient air striking a Faraday Cup and the output is passed to the processor board for determination of chemical agent presence.

6. The drift tube amplifier of claim 5, wherein the drift tube amplifier further includes decoupling capacitors, the decoupling capacitors in electronic communication with the drift tube amplifier such that the decoupling capacitors reduce power noise from any type of power source.

7. The drift tube amplifier of claim 6, wherein the output buffer includes a first order low pass filter, capacitors and resistors electronically communicating with each other.

8. The drift tube amplifier of claim 1, wherein the first order band pass filter includes a high pass filter and a low pass filter arranged in series.

9. The drift tube amplifier of claim 8, wherein the high pass filter is two capacitors in series.

* * * * *